US008369537B2

(12) United States Patent
Bieber et al.

(10) Patent No.: US 8,369,537 B2
(45) Date of Patent: Feb. 5, 2013

(54) CONTROLLING REPRODUCTION OF AUDIO DATA

(75) Inventors: Gerald Bieber, Papendorf (DE); Holger Diener, Rostock (DE); Malte Korten, Rostock (DE); Mathias Mainka, Rostock (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 1106 days.

(21) Appl. No.: 12/090,200

(22) PCT Filed: Oct. 12, 2006

(86) PCT No.: PCT/EP2006/009998
§ 371 (c)(1),
(2), (4) Date: Aug. 26, 2008

(87) PCT Pub. No.: WO2007/042329
PCT Pub. Date: Apr. 19, 2007

(65) Prior Publication Data

US 2009/0304204 A1 Dec. 10, 2009

(30) Foreign Application Priority Data

Oct. 13, 2005 (DE) ......................... 10 2005 049 485

(51) Int. Cl.
*H03G 5/00* (2006.01)

(52) U.S. Cl. ........................................................ 381/98

(58) Field of Classification Search ..................... 381/98
See application file for complete search history.

(56) References Cited

FOREIGN PATENT DOCUMENTS

| | | | |
|---|---|---|---|
| EP | 1533784 | A2 | 5/2005 |
| JP | 2001299980 | A | 10/2001 |
| WO | 8900064 | A1 | 1/1989 |
| WO | 2004007267 | A2 | 8/2004 |
| WO | 2005082472 | A1 | 9/2005 |
| WO | 2006043536 | A1 | 4/2006 |

OTHER PUBLICATIONS

Laroche, J: "Time and pitch scale modification of audio signals", in Applications of digital signal processing to audio and acoustics, edited by Kahrs, Mark and Brandenburg, Karlheinz, Kluwer Academic Publishers, 1998, pp. 279-309.
International Search Report dated Feb. 15, 2007.

*Primary Examiner* — Kimberly Rizkallah
*Assistant Examiner* — Errol Fernandes
(74) *Attorney, Agent, or Firm* — Laurence A. Greenberg; Werner H. Stemer; Ralph E. Locher

(57) ABSTRACT

For controlling the acoustic reproduction of audio data containing audio elements that are periodically repeated, movement data regarding a movement process is detected. The movement process contains recurring events. Reproduction of the audio data is controlled using the movement data in such a way that at least within a certain period, one out of n audio elements that are periodically repeated is reproduced in synchrony with the moment one of the recurring events occurs (synchronization) or is reproduced temporally offset by a given amount of time from the moment one of the recurring events occurs (offset synchronization). The value n represents a positive integer.

15 Claims, 4 Drawing Sheets

CONTROLLING REPRODUCTION OF AUDIO DATA

BACKGROUND OF THE INVENTION

Field of the Invention

The invention relates to a process and device for controlling acoustic reproduction of audio information. The invention relates in particular to acoustic reproduction in sport, for entertainment (for example in leisure activities) or in physical activity for therapeutic or diagnostic purposes.

In the majority of cases training processes contain motion sequences which periodically have recurring events. For example, when bike riding the trainee or sportsperson periodically and recurrently exerts pressure from above onto the right and/or left pedal of the bike. During running or walking the point in time of the event can be defined by the right and/or left foot striking the ground.

It is known to play during sport or training music for entertainment and motivation. Various studies have shown that during running both endurance and running performance are improved with music. Runners remain more relaxed, and breathing is deeper and more even. This results in the working muscles receiving more oxygen and the training effect is heightened. The respective sportsperson particularly prefers to hear favourite music when training. Yet the rhythm of the music does not often match the rhythm of the movement being undertaken or optimal movement for training. The person matches his/her movement to the music and for the most part falls short of the training goal. The inventors of this invention have already put forward a device which matches the music frequency the frequency of a periodically concurrent movement, without altering the pitch. The device and the corresponding process can be carried out for example as described in German patent application with publication number DE 103 09 834 A1, though this patent application concerns the reproduction of spoken information.

This process in particular enables the sportsperson to utilise the rhythm of the music for training or sport during movements which are performed over a long timeframe with constant time duration. Above all with movement sequences with changing rhythm it is however not easy for the trainee or sportsperson to match the music.

EP 1 533 784 A2 describes a control device for a reproduction mode and a process. Movements by a user in an up and down direction are detected. A detection unit detects the gait of the user, based on output from a vibration sensor. Control of the reproduction mode executes control for adjusting the reproduction rate of musical content to the gait of the user. Example 3 of the document describes how a musical reproduction device is not only not capable of modifying the reproduction speed, but also of synchronising the timing of the user to the beat of the music.

WO 2006/043536 A1 published on Apr. 27, 2006 describes how the timing of the gait of a walking user and the timing of a swing of the body of the user is detected. The content of a musical composition, a moving image or the like is reproduced in such a way that the detected timing is synchronised with the timing of the beat of the musical composition or the timing of a scene change of the moving image.

BRIEF SUMMARY OF THE INVENTION

It is an aim of the present invention to provide a process and a device of the type specified at the outset, which improves cooperation of the person in motion with the reproduced audio information. Another aim is that with changing time duration of movement the acoustically reproduced audio data promotes reaching the movement success.

It is proposed to control or regulate acoustic reproduction of audio data such that audio elements contained in the audio data, which repeat periodically, are reproduced in synchrony (in particular periodically) with recurring events. At the same time the synchronising can also occur offset by a specified time value against the respective point in time of the occurrence of one of the recurring events (offset synchronising). For example, a runner can want the audio element already to be reproduced when his foot is already on the ground, though is not yet exerting maximal force on the ground, where the point in time of the exertion of maximal force is detected and is the point in time of the recurring event.

In particular, a process for controlling acoustic reproduction of audio data is proposed, wherein

- the audio information exhibit audio elements which periodically repeat,
- movement information about a movement process, which comprises recurring events, are collected or such movement information are present,
- using the movement information reproduction of the audio data is controlled such that at least within a time period each n-th of the periodically repeating audio elements is reproduced at the same time with the point in time of the occurrence of one of the recurring events (synchronising) or is reproduced, with respect to time, by a specified time value offset against the point in time of the occurrence of one of the recurring events (offset synchronising), whereby n is a positive whole number.

Control of acoustic reproduction also means a process which can occur within a regulation.

Synchronising hereinbelow also means offset synchronising. The specified offset value (time value) is predetermined at least for individual periods. It can be changed however during reproduction and depends e.g. on quantities such as pulse frequency of a person. If the pulse frequency for example rises above a specified limit value the reproduction speed can be reduced, a warning signal can be emitted and/or for the first time an offset value or some other offset value can be specified as earlier for further synchronising. In all cases the persons in motion can be prevented from undertaking any further physical effort than is necessary.

Periodically repeating audio elements especially mean those elements of audio information to be reproduced, which indicate or form a rhythm, a cadence and/or a meter. At the same time, there can be, for example, audio signals produced by a drum set or another rhythm instrument (e.g. so-called beat) in the music. Also, elements of a meter (i.e. uniform basic beats without emphases) can be considered. A further possibility of periodic audio elements is rhythmical sequence of sounds and/or voice sounds with varying sound duration, which can occur corresponding for example to a basic pulse. The invention is however not limited to music. Rather, other audio information can also be reproduced, for example rhythmical animal sounds, noises produced by human voices (e.g. rhythmic speech) or artificially generated audio signals not designated as music.

The inventive synchronising of audio elements with movement events can itself be guaranteed almost at any time when the rhythm of the movement changes. For this reason the person (or persons) describing the movement experiences the reproduced audio data as a support to the movement. The person does not have not synchronise himself with the rhythm of the music or other audio information. For example, during training on a training bike the movement therefore does not have to be adapted to the music.

In particular, the respective audio element, which periodically repeats, can be altered until a fresh occurrence. This is the case e.g. for a drum solo. Also, the cycle period duration can be changed. For example, there is music with changing rhythm. All the same the momentary time duration (as will be explained in greater detail hereinbelow by way of an embodiment), which might result from unchanged reproduction of the audio data, can be determined. It is therefore also possible to synchronise reproduction of the audio data with the movement process, if the audio element and/or the cycle period duration changes.

The (particularly periodically) recurring events of the movement processes can be defined depending on the movement processes, but also in one and the same movement process in different ways. For running, the event is for example defined by the occurrence of the right and/or left foot on the subsurface. For biking, or other movement processes, which contain continuous movements as running, the point in time of the event can be defined e.g. by the occurrence of the greatest expenditure of force within a partial movement sequence or the occurrence of the greatest acceleration and/or by a specific pre-defined position of the respective movement mechanism (for example the rotary pedal position of a home trainer bike). For example, in the event of bike-riding the point in time can be established as the point in time of the event, at which the right and/or left foot exerts the greatest force acting on one of the pedals from above.

In addition to acoustic reproduction of the audio data optical information can be put out, e.g. light pulses and/or beam illustrations, wherein the length of the beam changes over time as known from equalizer displays. The optical information can be displayed for example with a suitable visor or suitable glasses, located in the field of vision of the person. At the same time the optical information is reproduced in synchrony to reproduction of the audio elements (for example in each case a light pulse at the same time as reproduction of each of the audio elements).

The course of synchronising and the input information underlying the synchronising (in particular the time sequence of recurring events and audio elements) can be protocoled and/or corresponding data can be recorded. This enables evaluation for subsequent analysis of the movement processes.

It is also possible that the movement process, about which the movement information are recorded, is performed by some person other than the person who hears the audio playback. For example, several people can be playing sport together and the movement of one of those people can be predetermined. Audio information, which is synchronised to the movement events of this person (first person) accordingly, can then be output audibly for all people. For example, information on the points in time of the movement events can be transmitted wireless by a device worn by the first person on the body to devices of the other people, in each case worn by the other people on their body and by which synchronising is carried out. It is also possible however that the already synchronised audio information is being transmitted to the other people. In any case the first person can thus specify the movement rhythm and the other people can correspondingly carry out their movements.

As already follows on from the preceding paragraph synchronising can take place at any place. In one configuration the data on the points in time of the movement events can be sent to a central device (e.g. fixed server), e.g. over a mobile radio network. The central device performs synchronisation and transfers the synchronised audio data for reproduction to those people carrying out the movement and/or to another person.

It is however preferred that both synchronisation and output of signals containing the synchronised audio data are performed by a device which is small and compact and can be worn on the body of a person. The device can be e.g. a modified MP3 player, a modified mobile phone or a modified PDA (personal digital assistant). The device can in particular have the arrangement in one of its configurations as described hereinbelow.

Reproduction of the audio information can be controlled such that at any occurrence of one of the recurring events of the movement processes in each case the next of the periodically repeating audio elements is reproduced acoustically. In particular, a characteristic point in time is defined both for the recurring event and for the audio element to be played back, also if playback of the audio element extends over a brief timeframe. The use of such points in time is however also preferred in general if in each case the next periodically repeating audio element is reproduced not at every point in time of the occurrence of one of the recurring movement events. In this general case each n-th of the periodically repeating audio elements is reproduced at least within a time period at the same time as the occurrence of one of the recurring events, wherein n is a positive whole number. These points in time of simultaneous occurrence are designated hereinbelow as synchronous time points.

In particular, the audio information is reproduced such that pitches of the audio information are not altered by synchronising. In this way the respective person e.g. senses the music not to be altered, even though the reproduction speed of the music was changed for synchronising purposes. Those processes describing a change in the reproduction speed of music are known e.g. from the following publications: Flanagan, J. L.; Golden, R. M.: "Phase Vocoder", Bell System Technical Journal, November 1966, pages 1493-1509, and Malah, D.: "Time-Domain Algorithms for Harmonie Bandwidth Reduction and Time Scaling of Speech signal", IEEE Transactions on Acoustics, Speech and signal Processing, Vol. ASSP-27: 121-133, April 1979.

These publications do not however describe the inventive synchronising.

However, these processes can be used for synchronising. For instance, the reproduction speed can be altered temporarily such that synchronising results. To be able to alter the speed e.g. Fourier transformation of audio information can be performed from the timeframe in the frequency space, as described in the publication by Flanagan. Typically unpleasant sounding effects (so-called "phasiness", "transient smearing") occur as a result of the transformation and the corresponding subsequent transformation. To dampen these effects additional procedural steps can be carried out (e.g. so-called "phase locking", as described in the following publication: Laroche, J.; Dolson, M.: "Improved Phase Vocoder Time-Scale Modification of Audio", IEEE Transactions on speech and audio processing, vol. 7, Nr. 3, Mai 1999, pages 323-332).

The abovementioned publication by Malah describes a process (the so-called Time-Domain Harmonie Scaling, TDHS), which is based on manipulation of the sound signal in the time range. Instead of transforming the signal in the frequency range the sound signal is divided in the analysis phase into small overlapping time ranges, which are expanded or respectively compressed individually.

In an embodiment of the invention blocks are formed with data from the audio data, wherein the data are partial data of the audio information. Where the reproduction speed remains unmodified (original) each of the blocks in each case corresponds to a time interval, required for reproduction of the data contained in the block. If the reproduction speed of a block is increased the quantity of data in the block is reduced. If the reproduction speed of a block is reduced the quantity of data in the block is increased. At the same time neither the increase in quantity of data nor the decrease in the quantity of data leads to an alteration in pitches relative to the original reproduction speed. This can be caused for example by the quantity of data being altered similarly as described in the publication by Malah.

Reproduction of the audio data is preferably controlled in such a way that at least within the time period of synchronisation each n-th of the periodically repeating audio elements is reproduced at the same time as the point in time of the occurrence of each m-th of the recurring events or is reproduced temporally by a specified time value offset against the point in time of the occurrence of each m-th of the recurring events, whereby n, m are positive whole numbers. It is also preferred that both the time duration of the audio elements and the time duration of the movement events is constant at least during the synchronised time period.

A configuration of the process is suitable for synchronising also in the case of a change in time duration of the movement events. At the same time reproduction of the audio data is controlled such that at least within a synchronised time period after and/or during the change in time duration each o-th of the periodically repeating audio elements is reproduced at the same time with an occurrence of one of the recurring events or is reproduced temporally by a specified time value offset against an occurrence of one of the recurring events, wherein o equals n or is another positive whole number. Whenever o does not equal n a change in rhythm in synchronisation takes place as a result.

One possibility of causing synchronising is calculating in advance a point in time, at which the next or one of the next recurring events of the movement will probably occur. Points in time of the occurrence of the recurring events for the past can thus be determined and/or correspondingly stored data can be evaluated. In this case a future point in time is forecast from the past points in time and it is calculated in advance as to how the audio information is to be reproduced up to the future point in time, so that an audio element of the audio information is reproduced at this point in time or by a specified time value offset against this point in time.

This method leaves leeway for different types of reproduction. In changing the time duration of the movement events, but also in other situations (e.g. at the beginning of reproduction), synchronisation should on the one hand be done (again) as fast as possible. On the other hand audible changes in speed (in particular jumps) in the reproduced audio data should be avoided.

The reproduction speed of the audio information up to the future point in time can be changed constantly, so that the audio element is reproduced at this point in time or by a specified time value offset against this point in time. In particular, the speed can be changed, at least intermittently, linearly up to the future point in time. The term change is in this context a change over time, not a change with respect to a normal reproduction speed. A change in the speed made in a first timeframe (relative to speed) linearly with a first constant rate of change and made in a second timeframe linearly with a second constant rate of change is particularly easy to calculate and yet barely perceivable for the listener, wherein the first and the second rate of change are different. Both timeframes can be successive. Due to the at least two different linear rates of change it is possible to change the speed linearly and also on completion of the time period, in which the speed is changed, to effect synchronising. In particular, synchronising can be effected by adjusting both linear rates of change.

According to the attached patent claims however synchronising is effected by regulating.

A signal sequence, which reproduces the time lapse of the occurrence of the movement events, is compared to a fedback (lying on the controlling circuit as output signal) signal sequence and the difference is adjusted to zero or to a predetermined time-offset value, by which the point in time of reproduction of the audio element deviates from the point in time of the event. At the same time the output signal is a signal which reproduces the time lapse of the occurrence of the recurring audio elements. This means that the audio data are reproduced such that the temporal sequence of the audio elements corresponds to the output signal of the controlling circuit.

Preferably, a comparator is used for comparison of both signals. The output signal of the comparator (corresponding to the difference of both signals) is fed to a filter (in particular a low-pass filter) as input signals. The output signal lying on the output of the low-pass filter is fed to an actuator controlling reproduction of the audio information. Also a device is provided which produces from the corrective signal (output signal of the actuator) and/or from the output signal of the low-pass-filter the output signal of the controlling circuit as defined hereinabove, which is fed back. Such regulating is known for other purposes as Phase Locked Loop (PLL).

Other regulating principles can also be used.

The advantage of feedback control is that with the exception of the actuator it can be composed of electronic, in particular standard microelectronic components. Also the actuator can have a standard electronic component, in particular a microprocessor. In this case however programming of the microprocessor is also necessary, as it carries out the inventive control of reproduction of the audio data. Alternatively the actuator can be part of a computer, also used for other functions, e.g. as calculation unit of a PDA and/or for decoding coded audio data (e.g. coded in MP3 format).

Such feedback control can furthermore be designed to be extremely robust, and does not require projection when the next or following movement event is to be reckoned with and how reproduction of the audio data correspondingly is to be synchronised.

An added advantage of the feedback control is that the calculating effort and thus the loading of a data processor in comparison to projection of the concurrence of movement events and audio elements are minimal. Also feedback control can react particularly fast to a change in input signals (e.g. of the movement rhythm). In particular, no frequency analysis for the feedback control is necessary.

A further aspect of the invention, which can be combined with the feedback control or also with another implementation of synchronising, should guarantee a defined, fast reaction to a change in the input variables of control or feedback control.

It is proposed to specify a timeframe and a measure (a time difference) for time deviation of intended synchronising of the movement events and the audio elements (i.e. deviation between the point in time of reproduction of the audio element and the point in time of the occurrence of the movement event). The specified timeframe begins when the measure for the deviation is reached or exceeded. The control or feedback control is executed such that—no later than on completion of the specified timeframe—the measure for the deviation is reached again or is fallen below.

This method or respectively correspondingly configured feedback control can be carried out for example by selecting suitable feedback control parameters. It is not necessary, during operation of feedback control, to monitor adhering to the timeframe, since the parameters of feedback control were selected from the outset such that the timeframe is adhered to. In selecting the parameters the assumption can have been made that the deviation is no greater than a specified value. The process, by which the specified timeframe and the specified measure are considered, can however also be part of the abovedescribed process, in which a point in time, at which the next or one of the next recurring events of movement probably will occur, is projected.

In particular, in the case of detecting steps of someone running, though also using other event detectors (e.g. mechanical sensors), it can result in so-called rebound effects, specifically the apparent occurrence of additional events. In comparison to the frequency of actually occurring recurring events these events occur however with higher frequency and are therefore preferably filtered out (in particular by a filter implemented in software). The filter can be e.g. a periodic filter and/or a filter based on modelling movement. The model can be used to show that a detected event is an artefact. The filtered signal can then be used for synchronising.

In particular, it is therefore proposed that the recorded movement data are filtered such that obvious movement events, which however have not actually occurred, are filtered out of the movement data or the influence of the apparent movement events on synchronising is diminished.

In a concrete embodiment the time difference of two successive movement events can be compared to a comparative value (rebound value maximum, e.g. 250 ms during running). If the difference is below the comparative value, one of the movement events is deleted from the movement data. Alternatively or in addition, fluctuations in a frequency determined from the movement events, with which the events occur, can be damped. The corresponding frequency signal subjected to damping can be used for synchronising.

One possibility for detecting the presence of the repeating audio elements in the audio data is that the abovementioned blocks are formed again. In particular, the data information contained therein point to the amplitude level of a signal as a function of time (e.g. data in the so-called wave format), whereby the signal can be used directly for controlling acoustic reproduction means such as loudspeakers. For one block in each case or for several temporally successive blocks a measure is ascertained for the amplitude level in the whole block or respectively in the sequence of blocks. At the same time negative and positive amplitude values similarly enter the determination. For example the quantity or the square of the amplitudes is considered. For example, the average time value of the square of the amplitude can be assessed as a measure. If the measure is over a limit value (which is ascertained e.g. from the outset or which can be ascertained depending on the result of evaluating a large number of blocks) it is decided that the block or the sequence of blocks contains the audio element, specifically a beat for instance, generated with a drum set, or another musical sound (in terms of an emphasis relative to other time segments).

For recognising the occurrence of audio elements frequency analysis in each case restricted to a specific timeframe, can be performed repeatedly. If the timeframe e.g. is defined by one of the abovementioned blocks, frequency analysis can be carried out for each of the blocks. The outcome of the frequency analysis provides for example an amplitude value for each of a large number of frequency bands. If the amplitude value lies in one of the frequency bands or in a specific in particular specified combination of frequency bands over a limit value (in particular defined specifically for the respective frequency band), the decision is made for an audio element (e.g. a beat) to occur in the timeframe.

Examples for a so-called "Beat-detection" are described for instance in Eric D. Scheirer: "Tempo and beat analysis of acoustic musical signal", J. Acoust. Soc. Am. 103 (1), January 1998, pages 588-601, or in G. Tzanetakis, G. Essl and P. R. Cook: "Audio Analysis Using the Discrete Wavelet Transform", published in "Proceedings of WSES International Conference, Acoustics and Music: Theory and Applications (AMTA)", Skiathos, Greece, 2001. Both publications are fully incorporated in this description.

An arrangement for controlling acoustic reproduction of audio data is also proposed, wherein the audio information comprises audio elements repeating periodically and wherein the arrangement comprises the following:

- a detection device for recording movement data via a movement process which has recurring events, and
- a control device, which is configured to control reproduction of the audio information using the movement data such that at least within a time period each n-th of the periodically repeating audio elements is reproduced at the same time (synchronously) with the point in time of the occurrence of one of the recurring events (synchronising) or is reproduced temporally by a specified time value offset against the point in time of the occurrence of one of the recurring events (offset synchronising), whereby n is a positive whole number.

The arrangement can be integrated in particular into a mobile device, which can be attached to the body of the user during movement and/or can be carried by the person. At the same time the detection device can be connected to one or more sensors for recording movement in terms of data signal technology; these sensors send signals according to movement. The detection device evaluates the signals and determines the recurring events therefrom. For example, the sensor is a pressure sensor placed in the shoe sole of a jogger or runner. Alternatively or in addition, e.g. at least one acceleration sensor (e.g. available from Analog Devices, Corporate Headquarters, One Technology Way, Norwood, Mass., USA under the name "ADXL202 DUAL-AXIS ACCELEROMETER") and/or at least one spring mechanism with a weight spring-loaded on a base can be used to determine the movement events. In the case of the weight spring-loaded on a base the generation for example of a signal is then triggered whenever the weight reaches and/or strikes a certain position.

The mobile device can be e.g. a known audio reproduction unit (e.g. an MP3 player, a mobile phone and/or a PDA, Personal Digital Assistant), modified such that it is capable of executing synchronisation.

Also part of the invention is a computer program which carries out the inventive process in one of its configurations running on a computer (e.g. a microelectronic CPU) or computer network.

Also part of the invention is a computer program with program-coding means for carrying out the inventive process in one of its configurations, if the program is run on a computer or computer-network. In particular, the program-coding means can be stored on a computer-readable medium.

Also part of the invention is a medium, on which a data structure is stored which can run the inventive process in one of its configurations after loading into working and/or main memory of a computer or computer network.

Also part of the invention is a computer program product with program-coding means stored on a machine-readable medium for running the inventive process in one of its configurations whenever the program is run on a computer or computer network.

At the same time a computer program product means the program as commercial product. It can be in any form, such as for instance on paper or computer-readable medium and can be distributed in particular over a data transfer network.

Embodiments of the invention will now be described with reference to the attached diagram. The individual figures of the diagram show:

DESCRIPTION OF THE INVENTION

Figure 1:
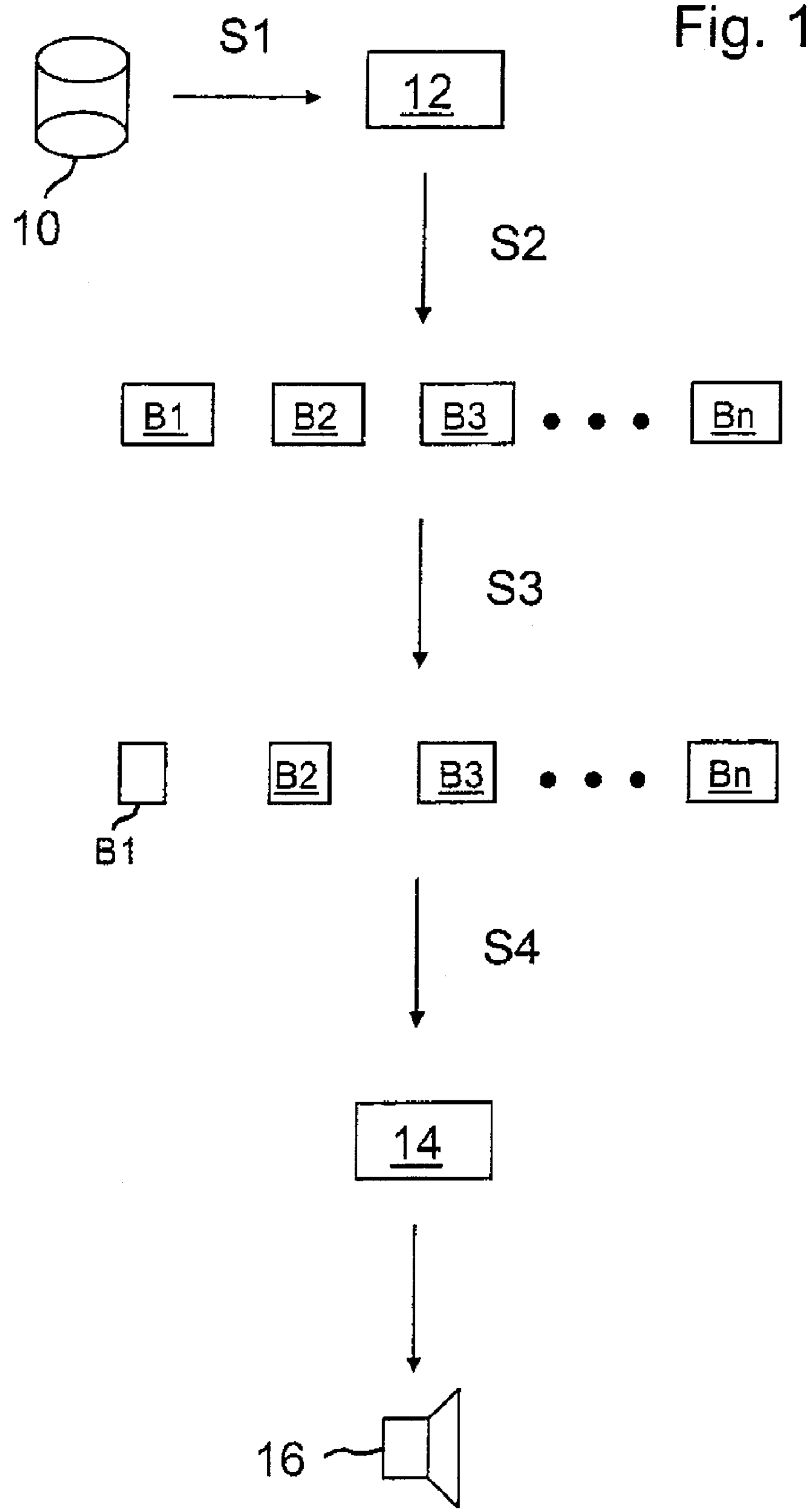
FIG. 1: a schematic illustration of procedural steps for reproduction of audio data.

An arrangement for controlling reproduction of audio data has for example elements now described by way of FIG. 1. At the same time these elements can be realised wholly or partially in a particular configuration by a single common hardware element (e.g. a microcomputer). Also, software can be provided which controls operation of the elements. In particular, control of the change in block sizes described hereinbelow is undertaken preferably by means of software.

Audio data are coded for example in a known manner (e.g. in MP3 format) and stored in a memory 10 (FIG. 1). In a first step S1 for reproduction of the audio data the coded data are read from the memory 10 and decoded in a decoding unit 12. Suitable amplitude values as output of the decoding are present for reproduction of the audio data as functions of time (e.g. data in so-called wave format).

In a second step S2 the decompressed data are structured in blocks B1, B2, B3 . . . Bn (e.g. administered by means of corresponding data fields by software). Each block B1, B2, B3 . . . Bn contains partial data of the decoded audio data, whereby at normal reproduction speed the respective part corresponds to a time interval of specified size. This means that the audio data administered in the respective block clearly determine reproduction of the audio data in the assigned time interval. Decoding continuously generates further decoded audio data, which can be stored in the interim e.g. in a buffer memory. In this way new blocks are constantly generated. The blocks form a temporally ordered sequence. For example, the data administered in block B2 are reproduced as soon as reproduction of the data administered in block B1 is complete. For example, the decoded data correspond to scanning of an analog audio signal at 44 kHz and in each case 256 temporally sequential scan values are administered in one block. The invention is however not limited to these numerical values. Other scan rates, variable scan rates and/or other structures of data-technical administration can be used.

An advantage of the block structure is that this structure can be used directly for modifying reproduction speed, for example it can be used for Fourier analysis. Such Fourier analysis occurs for example in an element of the arrangement not shown in FIG. 1 and which allows frequency-selective manipulation of data. Such manipulation is not a requisite for the present invention. The element for manipulation is for example a so-called equalizer.

In step S3 (FIG. 1) a change is made in the size of blocks B1, B2, B3 . . . Bn, that is, the quantity of data stored in the individual blocks is changed. If the quantity of data of a block is increased (e.g. from 256 scan values to 300 scan values), the time period required for reproduction of data of the block is increased. If the quantity of data of a block is decreased, the time period for reproduction of audio data of the block is reduced. In other words: the ratio of the quantity of data to the time required for reproduction of the quantity of data is constant. In step S3 (FIG. 1) the change in the quantity of data is made such that there is no resulting change in pitches. In the embodiment the quantity of data of block B1 decreases considerably, e.g. from 256 scan values to 200 scan values. The quantity of data in block B2 is further reduced, however only slightly as in block B1. An even slighter reduction in the quantity of data occurs for block B3. This first achieves a substantial increase in speed (block B1), further decreasing, in playback of blocks B1 to B3 relative to the normal reproduction speed.

In step S4 the audio data are subjected successively to further optional processing block by block (e.g. to match the volume and/or to match consecutive blocks for audio reproduction experienced by the hearer as pleasant, for example to cross-fade block transitions) and are transferred to a audio reproduction device, e.g. a loudspeaker or loudspeaker system 16. The further optional processing and forwarding are carried out by a device designated in FIG. 1 by reference numeral 14.

Details of step S3 will be described hereinbelow. At the same time this is an embodiment illustrated by FIG. 2. Step S3 can however also be carried out differently, for example using the output signals of the arrangement according to FIG. 3 and FIG. 4 to be described later on.

In step S20 it is continuously ascertained for blocks B1, B2, B3 . . . Bn as to whether a beat occurs in the respective block. Since in the embodiment at normal reproduction speed of music there are preferably more than 100 blocks per second (e.g. at a scan rate of 44 kHz and a block size of 256 scan values per block), the position of a beat can be ascertained with great precision. In light of the history of the occurrence of beats (e.g. through in each case considering the last 10 beats and their points in time at normal reproduction speed) when the occurrence of the next beat is to be expected can be calculated. For example, this is calculated at a future point in time under the assumption that the next beat continues the already occurring sequence of beats in the same way as before. At the same time the distance between the already occurring beats must not be constant. Rather, it can also be determined that the distance in each case between two beats has altered and the outcome of this finding can be utilised to calculate the point in time of the next beat.

There can also be different categories of beats, such as weak and strong beats. In a preferred configuration only the strong beats are considered and the audio data are reproduced such that only the strong beats are synchronised with the movement events.

These beats can also be synchronised with the movement events such that not every one of the movement events coincides temporally with a beat. During running this can be synchronised such that the beats are synchronised with the occurrence of the right foot (alternatively: with the left foot) on the ground. Further variants are possible, e.g. synchronising with every second occurrence of the right or left foot. In the case of particularly fast normal reproduction speed of the audio data can also be synchronised such that only each n beat (whereby n is a positive whole number greater than 1) is synchronised with the occurrence of the next foot (i.e. either of the right or left foot).

In particular, if the rhythm of the movement changes the type of synchronising can also be changed. The normal reproduction speed for synchronising is preferably altered by no more than a factor of 0.6 to 1.6 or particularly preferably by a factor of 0.75 to 1.5. It has eventuated that more abrupt slowing (as factor 0.6 or respectively 0.75) or stronger accelerating (by a factor of 1.6 or respectively 1.5) by the person in motion is experienced as disturbing, since the music or other audio data sometimes cannot be recognised.

A change in the type of synchronising can be necessary in particular for a movement frequency change as described above.

Figure 2:
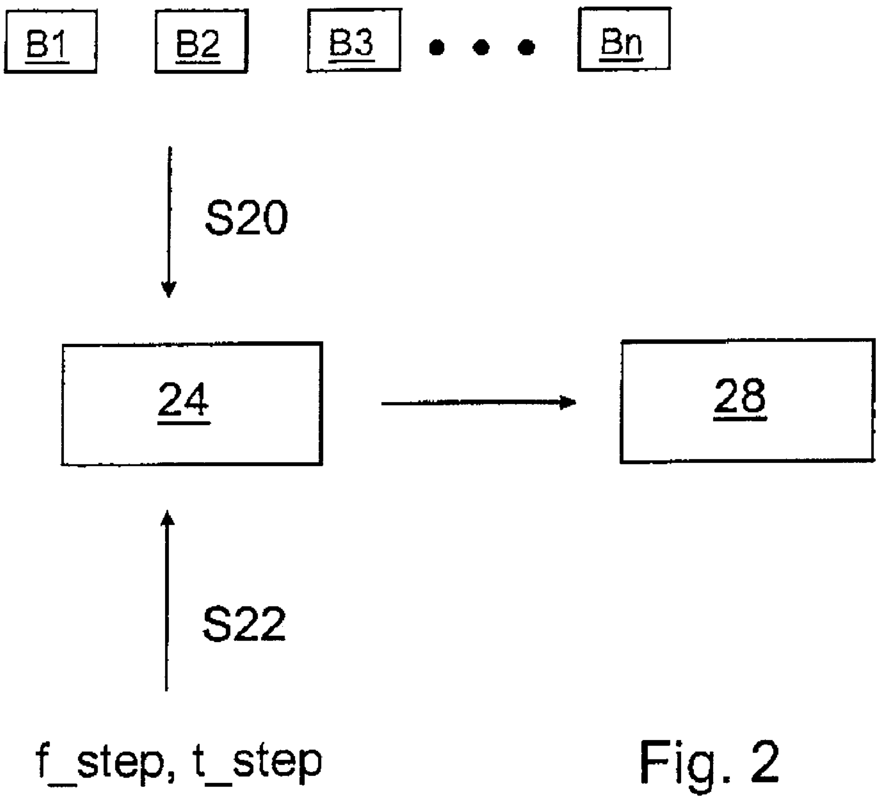
FIG. 2: a schematic illustration of procedural steps for synchronising.

The outcome of the evaluation in step S20 is fed to a first control device 24 (FIG. 2). Also the first control device 24 receives (e.g. from a foot counter) the frequency f_step and the point in time t_step. From this the first control device 24 calculates the quantity of data (e.g. the number of scan values at regular scanning of the originally analog audio data), to be added to the blocks or removed from the blocks, whereby only the entire quantity of data of those blocks is to be altered which are to be played back at the point in time of the next synchronisation of a beat and a movement event.

The outcome of the evaluation is fed to a second control device 28, whose task is to make the change in quantity of data in the individual blocks. If the factor of reduction or increase in quantity of data is temporally constant then all blocks to be played back can be increased or reduced by the same factor. If the reproduction speed however must be changed, the second control device preferably performs the following calculation method: the quantity of data per block is increased linear from the present point in time to the next synchronous time point, whereby however in a first part of the time period remaining up to the next synchronous point in time an increase is made by a first rate of increase from block to block, and whereby in the remaining partial time interval up to the next synchronous point in time an increase is made by a second rate of increase different to the first rate of increase the quantity of data from block to block. The same applies for decreasing the quantity of data per block. In this case the quantity of data is reduced up to the next synchronous time point with two different rates of increase from block to block.

Figure 6:
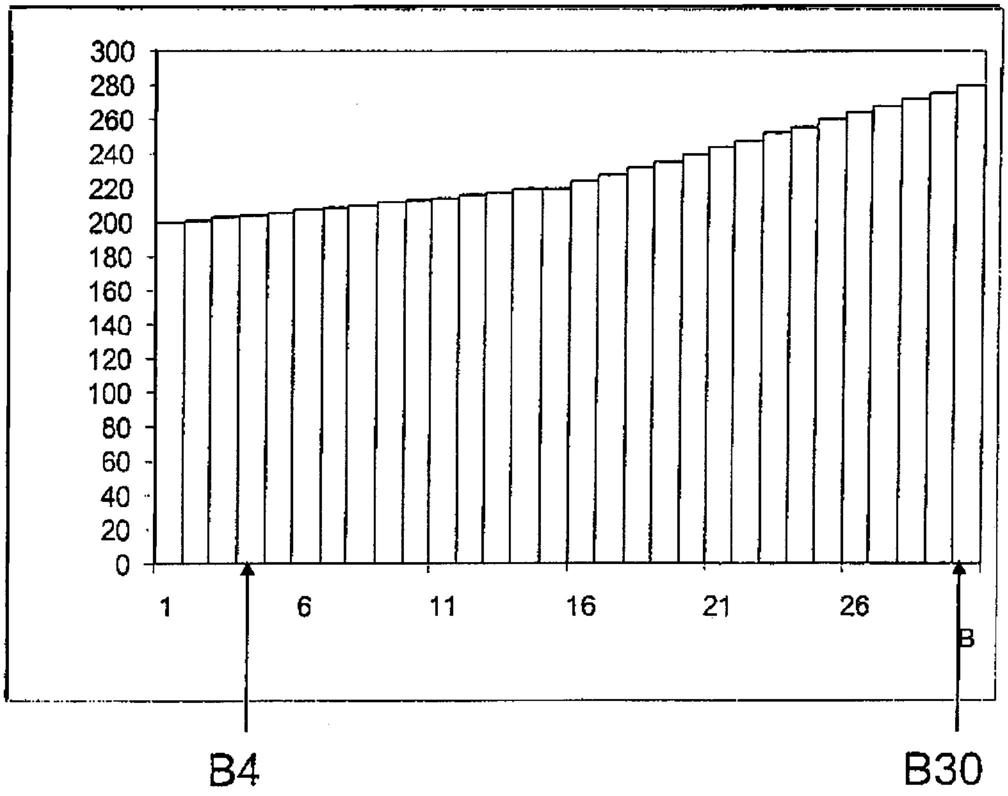

FIG. 6 illustrates a corresponding time lapse of block size. The serial number of the contained blocks is applied to the horizontal axis. The block limits are marked by vertical stripes. The quantity of data per block is applied to the vertical axis. As marked by B4 and an arrow the fourth block contains a beat. The next block, which contains a beat and is also to be synchronised with the occurrence of a movement event, is block 30 (marked with B30). The linear increase of the quantity of data per block of 200 scan values per block for block 1 up to 280 scan values per block for block 30 is evident. At the same time the rate of increase is constant from block 1 to block 14 and, with a greater rate of change, likewise is constant from block 15 to block 30.

With a drop in the quantity of data per block the quantity of data in each case is preferably altered accordingly over a partial time interval from block to block, again at two different constant rates.

Depending on the type of audio data the recognition performed in step S20 as to whether a block contains a beat, may also be carried out once only at the beginning of reproduction of the audio data, i.e. the time position and period of the occurrence of beats is ascertained at the commencement of reproduction. With this information a reliable prediction can be made using suitable audio data up to the end of reproduction as to in which block the occurrence of a beat is to be expected.

Figure 3:
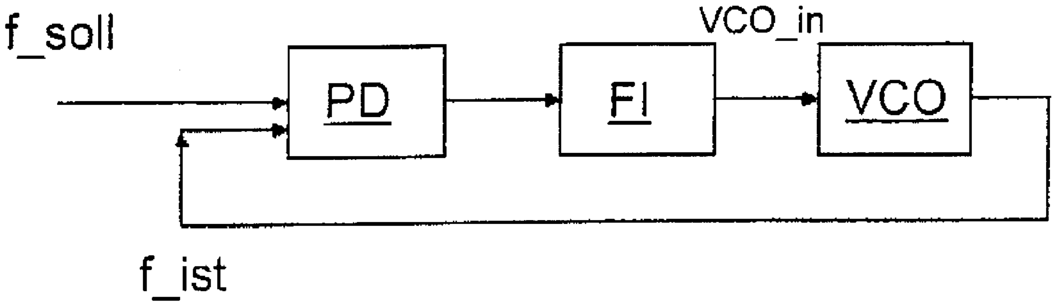
FIG. 3: a particularly preferred configuration of an arrangement for controlling (here: regulating) reproduction of audio data.
Figure 4:
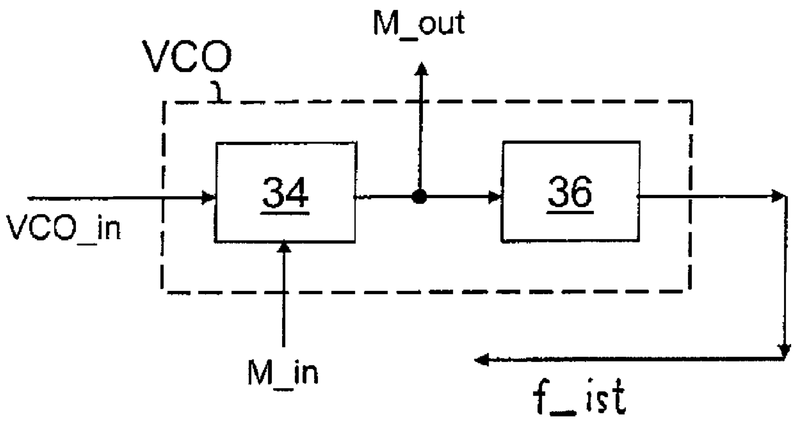
FIG. 4: a special configuration of an actuator of the arrangement illustrated in FIG. 3, FIG. 5: the time lapse of signals when the arrangement is running according to FIG. 3, and FIG. 6: a diagram explaining a second particularly preferred configuration of the invention.
Figure 5:
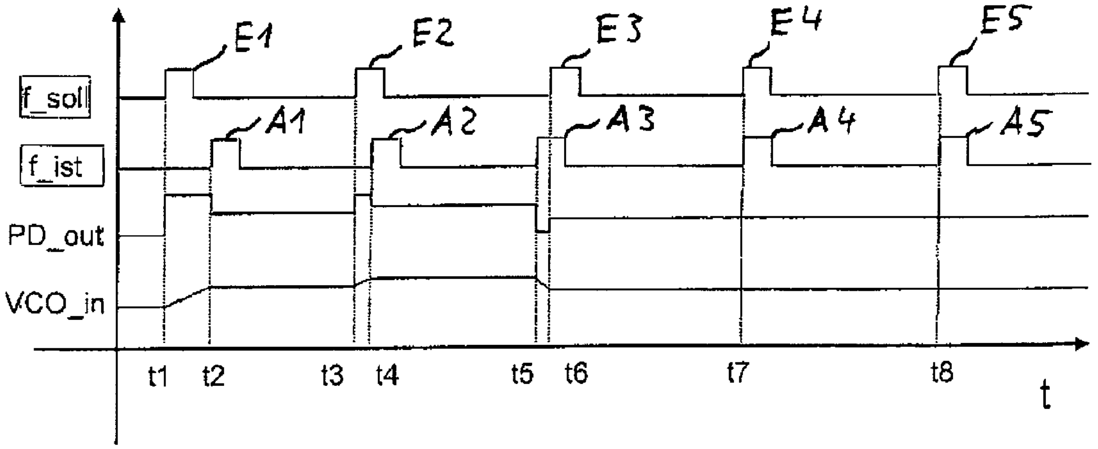

A further particularly preferred embodiment for controlling synchronising is now described via FIGS. 3 to 5. At the same time control is effected by a PLL-controlling circuit (FIG. 3). The controlling circuit has a phase comparator PD, a downstream low-pass filter Fl and a downstream actuator VCO. Two different input signals, both of which can be e.g. a 5-volt TTL signal, are fed to the comparator PD. In this case a briefly occurring higher signal level means the occurrence of a beat (in the signal f_actual=f_ist in the Figures) or respectively the occurrence of a movement event of movement (in the f_nominal signal, f_nominal=f_soll in the Figures). The comparator forms the difference of the signals f_nominal and f_actual and conveys the difference to the filter Fl. The adjustment behaviour of the controlling circuit can be adjusted by setting the parameters of the low-pass filter Fl. Due to the low-pass character brief (high-frequency) changes in signal difference (and thus deviations in synchronisation) are assessed less as long-term differences. The corresponding output signal of the filter Fl can therefore be used to adjust the actuator and thus alter the signal f_actual.

As FIG. 4 shows the actuator VCO is preferably realised by a first module 34 and a downstream second module 36. At the same time the first module 34 is configured in a special exemplary form for changing the size of the blocks to be reproduced depending on its input signal VCO_in. The audio data to be reproduced, or respectively the corresponding blocks, are likewise input data of the module 34, as indicated by M_in. If the input signal VCO_in means that the beats temporally lag behind the movement events (positive nominal value deviation) the module 34 reacts with an at least temporary drop in quantity of data of the blocks, so that the audio data in compared to normal reproduction speed are reproduced faster and so the beats are reproduced again at the point in time of the occurrence of the movement events. This situation underlies the signals illustrated in FIG. 5.

At the outset of the illustrated time range the movement event (beginning of the event at point in time t1) takes place at an earlier point in time than the beat (beginning of the beat at point in time t2). The output signal PD_out of the phase comparator PD increases therefore from the point in time t1 to a value greater than 0. The corresponding low-pass-filtered output signal VCO_in the filter Fl, which is the input signal of the module 34, therefore increases accordingly more slowly from the point in time t1 and from point in time t2 remains at a somewhat constant value, until the point in time t3 begins a new movement event. Up to the point in time t3 the module 34 has already reacted and accelerated playback of the music. So the time difference between the movement event (signal f_nominal) and the beat (signal f_actual) has become less. Due to the lazy character of the controlled system reproduction of the audio data occurs also at higher speed. The next beat at point in time t5 thus lies at point in time t6 prior to the beginning of the next movement event. The filtered output signal VCO_in of the filter Fl is accordingly reduced however.

With the next occurrence of the movement event at point in time t7 synchronising is almost completed. The minimal deviations can no longer be perceived by a moving person.

The correspondingly modified audio data are delivered to the output of the module 34 and can be used (as shown by M_out) for output e.g. to the loudspeaker 16. The signal M_out is also fed to the second module 36, which generates the signal f_actual therefrom. For example, for this purpose the second module 36 can perform detection of beats in the signal M_out. The detection of beats can be performed as described hereinabove by way of the unchanged audio data.

The invention claimed is:

1. A process for controlling acoustic reproduction of audio information containing periodically repeating audio elements, which comprises the steps of:

collecting movement information about a movement process containing recurring events;

using the movement information, for regulating reproduction of the audio information such that, at least within a time period, each n-th of the periodically repeating audio elements is one of reproduced at a same time with a point in time of an occurrence of one of the recurring events (synchronizing) and reproduced, with respect to time, offset by a specified time value against the point in time of the occurrence of one of the recurring events (offset synchronizing), wherein n is a positive whole number;

comparing a signal sequence, which reproduces a time lapse of the occurrence of the recurring events, to a fed-back signal sequence, available at an output of a regulating circuit as an output signal, the fed-back signal sequence reproduces a time lapse of an occurrence of the periodically repeating audio elements; and adjusting a time difference, resulting from the comparison, to zero or to a predetermined offset value, wherein the time difference is in each case a time difference between the occurrence of one of the periodically repeating audio elements and the occurrence of one of the recurring events.

2. The process according to claim 1, which further comprises using the movement information for regulating the reproduction of the audio information such that at least within a time period each n-th of the periodically repeating audio elements is one of reproduced at a same time with a point in time of the occurrence of each m-th of the recurring events and reproduced, with respect to time, offset by the specified time value against the point in time of the occurrence of each m-th of the recurring events, whereby n, m are positive whole numbers.

3. The process according to claim 1, which further comprises:

altering a time duration of the recurring events; and regulating reproduction of the audio information such that at least within a time period after and/or during a change to the time duration each o-th of the periodically repeating audio elements is one of reproduced at a same time with an occurrence of one of the recurring events and reproduced, with respect to time, offset by the specified time value against an occurrence of one of the recurring events, whereby o is equal to n or is another positive whole number.

4. The process according to claim 1, which further comprises reproducing the audio information such that pitches of the audio information are not altered by the synchronizing.

5. The process according to claim 4, which further comprises forming blocks with data, the data are partial data of the audio information, wherein with unchanged reproduction speed each of the blocks in each case corresponds to a time interval, required for reproduction of the data contained in the block, wherein a quantity of the data in at least one of the blocks is reduced to boost a reproduction speed and wherein the quantity of data in at least one of the blocks is increased to reduce the reproduction speed.

6. The process according to claim 1, which further comprises performing one of:

filtering the movement information recorded such that apparently occurring movement events, which in actual fact however have not occurred, are filtered out of the movement information; and filtering the movement information recorded such that an influence of an apparent movement on events on synchronising is reduced.

7. The process according to claim 1, wherein the points in time of the occurrence of the recurring events are determined for the past and/or corresponding stored information is evaluated, a future point in time is forecast from past points in time and a prediction is made as to how the audio information are to be reproduced up to the future point in time, so that an audio element of the audio information is reproduced at the point in time or around the specified time value offset against the point in time.

8. The process according to claim 7, which further comprises constantly modifying a reproduction speed of the audio information up to the future point in time, so that the audio element is reproduced at one of the future point in time and around the specified time value offset against the future point in time.

9. The process according to claim 8, which further comprises providing a comparator for a comparison and an output signal of the comparator is fed to an actuator that controls reproduction of the audio data.

10. The process according to claim 9, which further comprises:

feeding the output signal of the comparator to a filter as an input signal; and feeding an output signal of the filter to the actuator.

11. The process according to claim 9, which further comprises feeding back an output signal of a controlling circuit which is generated from at least one of an output signal of the actuator and from the output signal of the filter.

12. The process according to claim 10, which further comprises forming the filter as a low pass filter.

13. A computer readable medium having computer-executable instructions for performing the method which comprises the steps of:

collecting movement information about a movement process containing recurring events;

using the movement information, for regulating reproduction of the audio information such that, at least within a time period, each n-th of the periodically repeating audio elements is one of reproduced at a same time with a point in time of an occurrence of one of the recurring events (synchronizing) and reproduced, with respect to time, offset by a specified time value against the point in time of the occurrence of one of the recurring events (offset synchronizing), wherein n is a positive whole number;

comparing a signal sequence, which reproduces a time lapse of the occurrence of the recurring events, to a fed-back signal sequence, available at an output of a regulating circuit as an output signal, the fed-back signal sequence reproduces a time lapse of an occurrence of the periodically repeating audio elements; and adjusting a time difference, resulting from the comparison, to zero or to a predetermined offset value, wherein the time difference is in each case a time difference between the occurrence of one of the periodically repeating audio elements and the occurrence of one of the recurring events.

14. A configuration for controlling acoustic reproduction of audio information containing periodically repeating audio elements which repeat periodically, the configuration comprising:

a detection device for collecting movement information about a movement process having recurring events; and a regulating device configured to control reproduction of the audio information using the movement information such that at least within a time period each n-th of the periodically repeating audio elements is one of reproduced at a same time with a point in time of an occurrence of one of the recurring events (synchronizing) and reproduced, with respect to time, offset by a specified time value against the point in time of the occurrence of one of the recurring events (offset synchronizing), whereby n is a positive whole number, said regulating device containing a regulating circuit having an actuator, an output and a comparator, said comparator having a first input receiving a first signal sequence reproducing a time lapse of an occurrence of the recurring events, and a second input receiving an output signal fed back by said output of said regulating circuit being a second signal sequence, the second signal sequence reproducing a time lapse of the occurrence of the periodically repeating audio elements, said comparator having an output outputting an output signal reproducing a time difference in each case between one of the audio elements and one of the recurring events, said output signal of said comparator being fed to said actuator as an input signal, said regulating circuit configured to adjust a time difference, resulting from the comparison, to zero or to a predetermined offset value, wherein the time difference is in each case a time difference between the occurrence of one of the periodically repeating audio elements and the occurrence of one of the recurring events.

15. The configuration according to claim 14, wherein said detection device is connected to said first input of said comparator; and further comprising a device configured to generate the fed-back output signal from an output signal of said actuator, said device having an output, on which the fed-back output signal is available, connected to said second input of said comparator.

* * * * *